United States Patent
Kunz et al.

(10) Patent No.: US 8,745,862 B2
(45) Date of Patent: Jun. 10, 2014

(54) METHOD FOR DRILLING REFERENCE BORES INTO PRINTED CIRCUIT BOARDS

(75) Inventors: Stephan Kunz, Kronberg (DE); Markus Vos, Ingelheim (DE)

(73) Assignee: Schmoll Maschinen GmbH, Rodermark-Oberroden (DE)

( * ) Notice: Subject to any disclaimer, the term of this patent is extended or adjusted under 35 U.S.C. 154(b) by 922 days.

(21) Appl. No.: 12/642,435

(22) Filed: Dec. 18, 2009

(65) Prior Publication Data
US 2010/0154184 A1    Jun. 24, 2010

(30) Foreign Application Priority Data
Dec. 22, 2008   (DE) .......................... 10 2008 064 166

(51) Int. Cl.
*H01K 3/10* (2006.01)
(52) U.S. Cl.
USPC .......................................................... 29/852
(58) Field of Classification Search
USPC ...... 29/852, 26 R, 26 A, 56.6; 408/1 R, 3, 16, 408/17, 76.8, 95
See application file for complete search history.

(56) References Cited

U.S. PATENT DOCUMENTS

| | | |
|---|---|---|
| 4,019,826 A | 4/1977 | Block |
| 4,605,344 A | 8/1986 | Hartmann |
| 4,790,694 A | 12/1988 | Wilent et al. |
| 4,997,319 A * | 3/1991 | Arai et al. .................... 408/17 |
| 5,087,156 A | 2/1992 | Kanaya et al. |
| 2007/0114210 A1 | 5/2007 | Reinhold |

FOREIGN PATENT DOCUMENTS

| | | |
|---|---|---|
| CN | 1575097 A | 2/2005 |
| DE | 3333978 | 4/1985 |
| DE | 29712034 | 9/1997 |
| DE | 10221532 | 11/2003 |
| EP | 0 135 852 | 4/1985 |
| JP | 2001-315011 | 11/2001 |
| JP | 2002-066994 | 3/2002 |

OTHER PUBLICATIONS

German Office Action for related German Patent App. No. 102008046166.9-34, dated Mar. 23, 2010.

* cited by examiner

*Primary Examiner* — Thiem Phan
(74) *Attorney, Agent, or Firm* — McDonnell Boehnen Hulbert & Berghoff LLP

(57) ABSTRACT

An automated machine tool with a workpiece carrier for receiving a printed circuit board, at least one drilling station for processing printed circuit boards, and a mechanism for sequentially applying individual printed circuit boards onto the workpiece carrier and for removing printed circuit boards from the workpiece carrier.

5 Claims, 3 Drawing Sheets

METHOD FOR DRILLING REFERENCE BORES INTO PRINTED CIRCUIT BOARDS

RELATED APPLICATIONS

Figure 1:
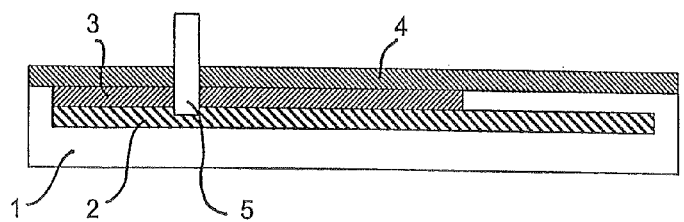

This application claims priority under 35 U.S.C. §119(b) to German Patent Application No. 10 2008 064 166.9, filed on Dec. 22, 2008, the full disclosure of which is incorporated herein by reference.

The invention concerns an automated machine tool with a workpiece carrier for receiving a printed circuit board, at least one drilling station for processing printed circuit boards, as well as a mechanism for sequentially applying individual circuit boards onto the workpiece carrier and for removing printed circuit boards from the workpiece carrier. Further, the invention concerns a method for drilling reference bores into printed circuit boards.

The processing of printed circuit boards (so-called panels) is performed manually or most often automated by machine tools that must capture the precise position and/or alignment of the printed circuit board with high precision, in order to be able to achieve precise processing. Concerning this it is known that printed circuit boards are provided with reference bores prior to the actual processing that are captured in the subsequent processing steps by the machine tools, for example, with a CCD camera and/or are used as reference in order to then, for example, drill bores into the printed circuit boards.

The quality of reference bores of this type must be particularly high for the optical capture of the reference bores. In particular, a bur, which is often created upon entry of the drill into the printed circuit boards, can make the exact optical capture of the reference bore significantly more difficult. The precision of the subsequent processing steps thus declines when the quality of the reference bore is bad. In mechanical indexing, for example, by pins, the bur can also negatively influence the precision of the reception.

When a covering layer (entry) and/ora support layer (backup) are provided in the processing of workpieces before the workpieces are drilled, this covering layer (entry) and/or supporting layer (backup) are discarded after the processing of the workpiece. In the processing of printed circuit boards (panels) it is disadvantageous, to cover the printed circuit board with a covering layer, particularly prior to drilling the reference bores, as this makes capturing the position and/or the alignment of the printed circuit board on a workpiece carrier more difficult with a CCD camera or an X-ray device or even prevents such.

In contrast, it is the problem of the present invention to provide a machine tool as well as a method of the type mentioned at the beginning, that makes cost-effective drilling of reference bores possible at high quality and with short clock cycles.

This problem is solved with an automated machine tool of the type mentioned at the beginning thereby, that the mechanism for sequential application of individual printed circuit boards (panels) onto the workpiece carrier and for removing printed circuit boards from the workpiece carrier is designed and/or equipped in such a way that the printed circuit boards are applied to the workpiece carrier at a defined offset with respect to the preceding printed circuit board. Beyond that, a second mechanism is provided for applying a covering layer (entry) onto the printed circuit board that is respectively positioned on the workpiece carrier and for detaching the covering layer from the printed circuit board. A control can actuate the drive of the workpiece carrier, the drilling station, the first mechanism and the second mechanism. In other words, the machine tool in accordance with the invention combines a so-called panel shift function by means of which sequentially processed printed circuit boards (panels) are applied to the workpiece carrier—not in the same position, but offset with respect to each other, as well as the provision of a covering layer on the panels. The use of the covering layer ensures that the reference bores can be drilled at very high quality and especially without a bur at the entry point of the drill into the printed circuit boards.

In accordance with the invention, the covering layer can thereby be used for the processing of many sequential printed circuit boards and does not have to be exchanged or discarded after each processed printed circuit board, as the printed circuit boards are applied to the workpiece carrier at a defined offset raster. Consequently, the bores are also drilled in positions of the workpiece carrier and the covering layer that are offset to each other. As the panels are placed onto the workpiece carrier without the covering layer, the precise position and alignment of the printed circuit boards can be captured respectively before the covering layer is applied. This is required when capturing the position and alignment of the panels using a CCD camera or the like. When using X-ray processes for capturing the position of the printed circuit boards, the covering material can also be selected in such a way that such is applied to the printed circuit board even prior to capturing the position.

According to a first embodiment of the invention, the second mechanism has grippers, especially provided with several suckers or a bracket for raising and lowering the covering layer on the workpiece carrier. The raising and lowering of the covering layer thus takes place by means of a mechanism that can be independent of the workpiece carrier and its drive and is provided, for example, in the posterior space or the interior space of the machine. This mechanism can deposit the covering layer onto the respective printed circuit board prior to each drilling cycle and subsequent to such, receive it again. As a result of the offsetting of the printed circuit boards in the panel shift, each hole is thus drilled at a new position.

By developing this inventive idea further, the workpiece carrier for raising and lowering the covering layer can be displaced under the gripper. Thus, the gripper can be designed as a comparably simple unit that must only retain the covering layer by means of suckers or the like and must raise and lower it in defined manner. Hereby, the drive of the workpiece carrier that is provided anyway is used, which makes it possible that the workpiece carrier moves under the gripper together with the printed circuit board that is placed on it when the covering layer is to be applied or detached. In other words, the workpiece carrier (machine table) is moved respectively out of the processing position or panel change position under the entry system. This can take up to 5 seconds.

Alternatively, it is also possible that the gripper or bracket has a dedicated drive, whereby the gripper or bracket for raising or lowering the covering layer can be moved above the workpiece carrier. The covering layer is hereby not only applied and detached, but also placed into the correct position above the workpiece carrier. Although this is connected with increased expense as a result of the additional drive of the gripper or bracket, it can, however lead to a lowering of the cycle times in a drilling cycle. In this case, the covering layer is preferably clamped into a frame or similar bracket.

According to a second embodiment of the invention, the second mechanism is designed as a carrier for the covering layer (entry), whereby the carrier of the drilling station is dedicated in such a way that the covering layer jointly with the drilling station can be positioned relative to the workpiece carrier and/or a printed circuit board that is located on such.

This embodiment is based on the idea that the drilling station must be aligned relative to the workpiece carrier or the printed circuit board for processing of the printed circuit board. When the covering layer is dedicated to a carrier of the drilling station, the covering layer is automatically placed in the correct position jointly with the drilling station relative to the printed circuit board or the workpiece carrier.

Hereby, it has been shown as being advantageous when the covering layer is essentially linear, whereby the second mechanism is provided with coils for defined coiling and uncoiling of the linear covering layer. The coils with the covering layer are thereby located at the drilling station in such a way that the covering layer is drilled through in each drilling process. The coils ensure that the linear covering layer is incrementally moved forward after each drilling process so that each bore is drilled into a new position in the covering layer. The coils can simultaneously be used for pressing the covering layer onto the printed circuit board or onto the workpiece. For a change of drills, the coils can be located at the drilling station where they can be folded away or swiveled away.

Alternatively, the covering layer can be designed as a disc that can be displaced relative to the drilling station. This disc can be provided, for example, on a carrier that is positioned next to the drilling station in such a way that the covering layer jointly with the drilling station is displaceable relative to the printed circuit board and/or the workpiece carrier. The disc-like covering layer can thereby also be incrementally rotated and/or moved relative to the drilling station, so that the covering layer is drilled at a new position in each drilling process.

It is preferred that the covering layer is a disc or a film with a thickness of approximately 0.1 mm to approximately 1 mm, particularly approximately 0.2 mm to approximately 0.5 mm. The material of the covering layer (entry) can be aluminum or plastic, for example, melamine. Thereby, the covering layer must be sufficiently stiff so that even if it contains multiple bores it can be safely deposited on the workpiece carrier or on a printed circuit board in order to be able to be detached from such. Otherwise, the material of the covering layer must also make a good penetration of the drill possible and prevent the formation of burs in the printed circuit board.

The quality of the bores that are to be drilled into the printed circuit boards can be further improved thereby, theta covering layer is not only provided on the side facing the drilling station, but also that a supporting layer (backup) is provided between the workpiece carrier and the printed circuit board. This supporting layer is preferably detachably fixated on the workpiece carrier, for example, by means of suckers, so that the printed circuit boards that are to be processed sequentially are applied offset to each other on the disc-like supporting layer. This achieves that not only in the covering layer (entry), but also in the supporting layer (backup), every hole is drilled at a new position, whereby a frazzling of the drill hole in the section of the drill exit can be prevented.

In order to make this offset of the panels possible, the surface, at least of the supporting layer, is larger than the surface of the printed circuit board that is to be processed respectively. When the supporting layer is significantly larger than the printed circuit boards that are to be processed, a large number of printed circuit boards can be processed with the panel shift function before the supporting layer, as well as perhaps the covering layer must be changed.

Prior to the drilling of the reference bores into a printed circuit board it is necessary to precisely capture the position and alignment of the printed circuit board itself. For this purpose, the control of the machine tool in accordance with the invention has a dedicated capturing unit, for example, a CCD camera or an X-ray device, so that the position and/or alignment of the printed circuit board on the workpiece carrier or on the supporting layer can be determined precisely.

The problem on which the invention is based is solved further by a method for drilling reference bores into printed circuit boards, which has the following steps:
a) applying a printed circuit board that is to be processed to a defined position on a supporting layer that is detachably fixated on a workpiece carrier,
b) applying and/or pressing on of a covering layer onto at least one section of the printed circuit board,
c) processing the printed circuit board by drilling at least one bore into the printed circuit board,
d) detaching the covering layer from the printed circuit board and
e) removing the processed printed circuit board,
f) repeating steps a) to e) without exchanging the supporting layer and the covering layer,
whereby prior to step c) the position and/or the alignment of the printed circuit board is captured, and whereby the supporting layer, the printed circuit board that is to be processed and the covering layer are aligned relative to each other prior to step d) in such a way that the bore holes that are created in the sequential processing of several printed circuit boards in the supporting layer and in the covering layer are offset with respect to each other in a defined raster. This process can be performed especially by an automated machine tool of the type mentioned above.

If the position and/or the alignment of the printed circuit board is captured by means of optical processes, for example, by remembering passes with a CCD camera, this must take place prior to the application and/or pressing on of the covering layer onto the printed circuit board. On the other hand, when the position and/or alignment of the printed circuit board is captured by X-ray, this can also take place after the application of the covering layer. Depending on the thickness of the printed circuit board, as well as the material of the covering layer it can, however, also be advantageous when the printed circuit board is measured by means of X-rays, that the position and/or alignment of the printed circuit board is captured before the covering layer is applied.

The defined offset of the bore holes that are created in the supporting layer and in the covering layer is created according to the invention thereby, that for several—particularly those that are constructed in the same way—printed circuit board that are to be processed sequentially, the bores are created at least essentially in the same position on the printed circuit boards, whereby the printed circuit boards that are to be processed sequentially are applied respectively offset to each other onto the supporting layer or the workpiece carrier (panel shift function).

It has been shown to be particularly advantageous in practice, when after a series of essentially identically constructed printed circuit boards that are processed by a machine tool according to the invention or by a method according to the invention, the supporting layer and/or covering layer are exchanged. In the case of a very large number of printed circuit boards that are to be processed this should also take place preferably after a pre-selectable number of bore holes, so that it remains ensured that each hole is drilled at a new position in the supporting layer (backup) and the covering layer (entry). For this purpose, the covering layer is displaced defined in a plane perpendicular to the plane of the drill direction prior to the positioning of a new drill hole relative to a drilling station or similar arrangement for positioning of boreholes.

In the following, the invention is explained in more detail by means of examples of embodiments and by referring to the drawing. Schematically shown are:

FIG. 1 a cross section view of a printed circuit board (panel) during the drilling of a reference bore.

Figure 2:
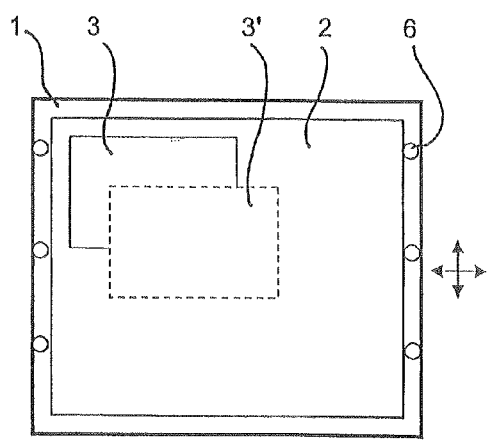
Figure 2:
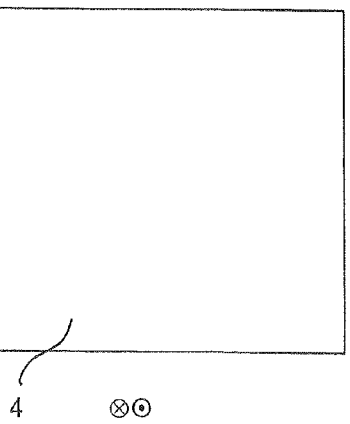
Figure 3:
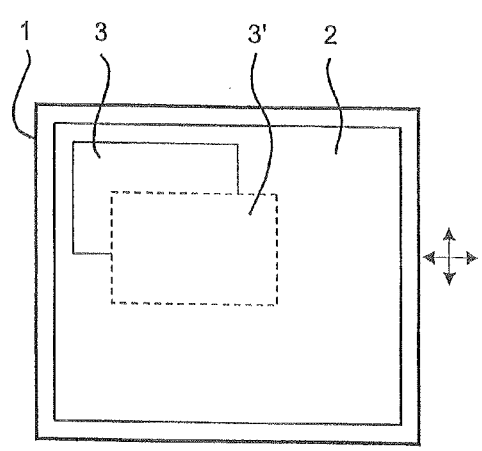
Figure 3:
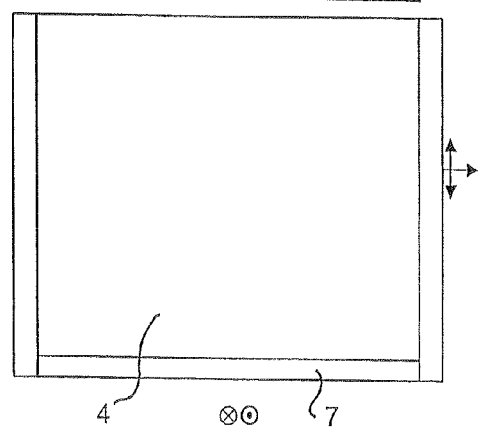
Figure 4:
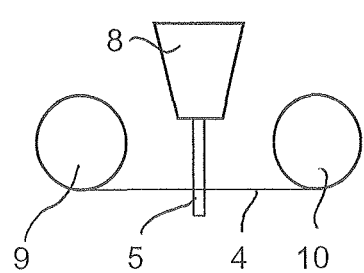
Figure 5:
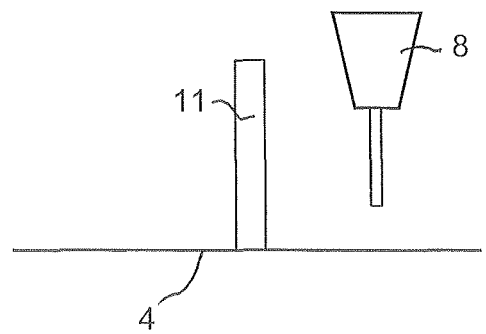
Figure 6:
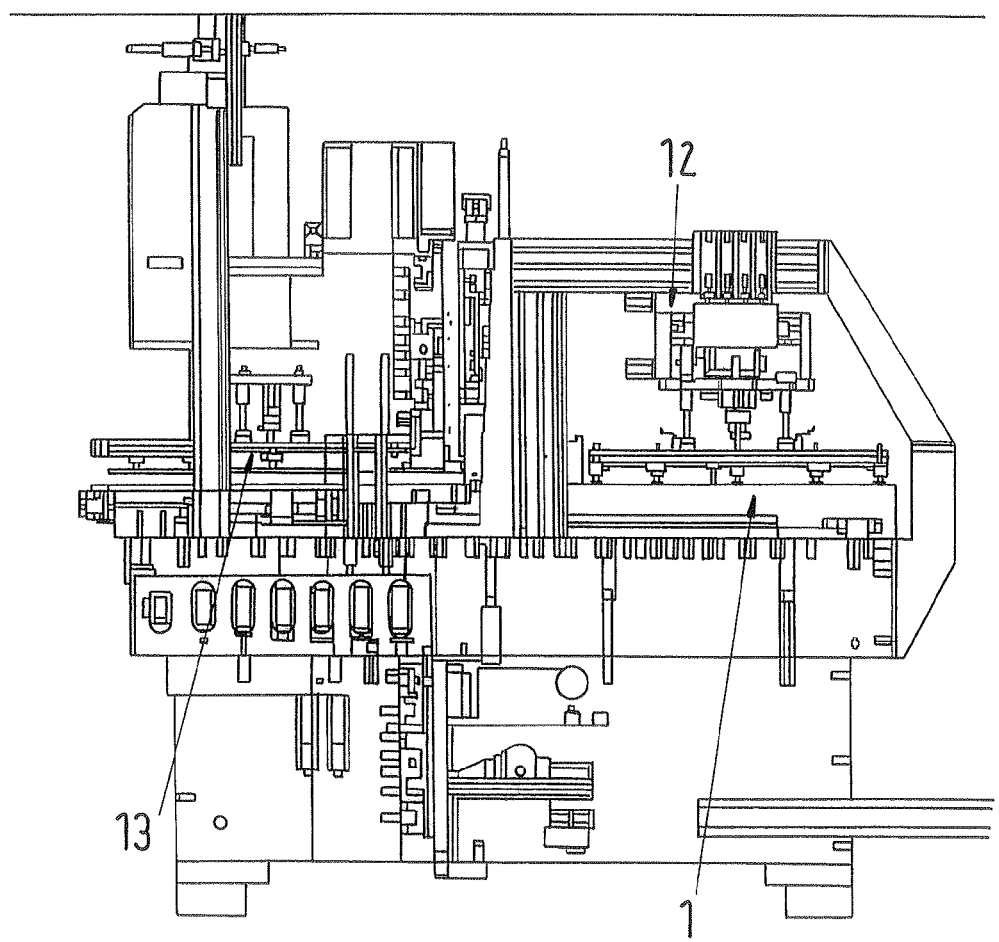

FIG. 2 a top view of the components of a machine tool according to a first embodiment of the invention, FIG. 3 a top view of the components of a machine tool according to a second embodiment of the invention, FIG. 4 a drilling station with dedicated covering layer of a machine tool according to a third embodiment of the invention, FIG. 5 a drilling station with dedicated covering layer of a machine tool according to a fourth embodiment of the invention, and FIG. 6 a lateral view of a machine tool according to FIG. 2.

FIG. 1 shows a workpiece carrier 1 of a machine tool, on which a supporting layer (backup) 2 is detachably fixated by suckers or the like that are not shown. A printed circuit board (panel) 3 is applied to the supporting layer 2 at a defined position. The printed circuit board 3 is shown as a layer in the figure, it can, however, also consist of several layers. Above printed circuit board 3, a covering layer (entry) 4 is applied, that can consist of a thin film of aluminum or plastic. Above a drill 5 of a drilling station that is not shown in FIG. 1, a reference bore is drilled into printed circuit board 3. The drill 5 thereby first penetrates covering layer 4, then the printed circuit board 3 and finally penetrates the supporting layer 2. The covering layer 4 and the supporting layer 2 thereby prevent that burs or frazzles are created in the entry section or exit section of the drill 5 in printed circuit board 3 during the drilling process.

In contrast to a conventional machine table, the workpiece carrier 1 shown in FIG. 1 is different, as a recess for the supporting layer 2 and the printed circuit board 3 is formed. As a result, even for a panel thickness that is 1.2 mm, the covering layer material can, if necessary, be attached by a separate (vacuum) clamping system. For a panel thickness 1.2 mm, the covering layer can be retained together with the supporting layer in the margin sections of workpiece carrier 1.

In FIG. 2, a first embodiment of the machine tool is shown. Thereby, as is shown by the arrows, the workpiece carrier 1 can be moved in the plane of the drawing. The supporting layer 2 is fixated on workpiece carrier 1 and is displaced jointly with it. By means of a mechanism that is not shown, a printed circuit board 3 is applied to supporting layer 2 in each drilling cycle. As is shown by the dotted lines, in the sequential processing of several printed circuit boards 3, 3', each printed circuit board is positioned offset with respect to the preceding printed circuit board on the supporting layer 2 and the workpiece carrier 1. In the posterior space of the machine tool, a mechanism is provided that is also not shown in further detail by means of which the covering layer 4, as indicated by the arrow, can be raised and lowered.

After placing a printed circuit board 3 on the supporting layer 2, the workpiece carrier 1 jointly with the supporting layer 2 and the printed circuit board 3 is moved under covering layer 4, so that the covering layer 4 can be lowered to workpiece carrier 1. As a result of schematically indicated suckers 6, the covering layer 4 can be detachably affixed onto workpiece carrier 1. The workpiece carrier 1 then moves back—jointly with supporting layer 2, the printed circuit board 3 and covering sheet 4—into a position that makes the drilling of reference bores possible by a drilling station that is not shown in further detail. Subsequently, the workpiece carrier 1 is again moved under the unit for depositing and grabbing the covering layer 4, so that the covering layer can be detached. Thereby, the covering layer is respectively placed in the same position of the workpiece carrier 1, so that by the offset of printed circuit boards 3, 3', the bores are always drilled at different positions of supporting layer 2 and covering layer 4.

The production process of the machine shown in FIG. 2 provides for the following steps for drilling reference bores:
1. Entry (covering layer 4) hangs on the gripper.
2. Panel (printed circuit board 3) is placed on the machine table (workpiece carrier 1) and is retained together with the backup (supporting layer 2) by the vacuum clamping system.
3. Panel is calibrated by X-ray.
4. Machine table moves back below the entry system.
5. Gripper deposits entry (≤5 sec.).
6. Entry is held by vacuum clamping system.
7. Panel is drilled.
8. Machine table moves under the entry system.
9. Clamping system is opened temporarily. Entry is lifted by means of gripper (≤5 sec.).
10. Machine table moves into the panel change position, the completed panel is removed, the next panel is applied offset by a "shift".

The set-up cycles of backup and entry are supported by software.

The machine tool shown in FIG. 3 differentiates itself from the embodiment shown in FIG. 2 thereby, that the mechanism for depositing and grabbing covering layer 4—in turn not shown in further detail—is provided with its own drive so that, for example, covering layer 4, clamped into in a schematically indicated frame 7, as indicated by arrows, can be moved over the workpiece carrier 1 and lowered or raised there. The workpiece carrier 1 must thus not be moved respectively beneath the mechanism to applying or detaching the covering layer.

In the embodiment according to FIG. 4, the covering layer 4 is dedicated to a schematically shown drilling station 8. For this purpose, two coils 9 and 10 are provided, on which the linear material of covering layer 4 of this embodiment is coiled or uncoiled. Coils 9 and 10 can thereby be jointly aligned with the drilling station 8 relative to panel 3 or workpiece carrier 1. While drilling a bore, drill 5 of drilling station 8 penetrates the covering layer 4, which abuts printed circuit board 3. After each drilling process, the covering layer 4 is incrementally moved further by coils 9 and 10, so that each bore is drilled into a new position of covering layer 4.

In the embodiment according to FIG. 5, instead of coils 9 and 10 with the linear covering layer 4, a disc-like covering layer 4 and a carrier 11 are provided, that are also dedicated to drilling station 8. The disc-like covering layer 4 can thereby be rotated by means of carrier 11, and is also perhaps located displaceable relative to drilling station 8, whereby it is also achieved that each bore is inserted in a new position of the covering layer 4. As explained above with reference to FIG. 4, carrier 11 is to be dedicated to drilling station 8 in such a way, that such are aligned jointly relative to the workpiece carrier 1 and the panel 3.

The illustration in FIG. 6 shows a machine tool in accordance with the invention with a loader and unloader 12 for printed circuit boards 3, as well as with a gripper system 13 for the covering layer material 4, which is located in the posterior space or interior space of the machine.

REFERENCE NUMBER LIST

1 Workpiece carrier
2 Supporting layer (backup)
3, 3' Printed circuit board (panel)
4 Covering layer (entry)
5 Drill
6 Sucker
7 Frame
8 Drilling station
9, 10 Coils
11 Carrier
12 Loader and unloader
13 Gripper system

The invention claimed is:

1. A method for drilling reference bores into printed circuit boards, particularly by using a machine tool, the method comprising the steps of:
   a) applying a printed circuit board that is to be processed at a defined position on a supporting layer that is detachably fixated in a recess of a workpiece carrier,
   b) applying and/or pressing on a covering layer on at least one section of the printed circuit board,
   c) capturing the position of the printed circuit board,
   d) processing the printed circuit board by drilling at least one reference bore in the printed circuit board,
   e) detaching the covering layer from the printed circuit board and
   f) removing the processed printed circuit board,
   g) repeating steps a) to e) without exchanging the supporting layer and the covering layer,
   whereby the supporting layer, the printed circuit board that is to be processed and the covering layer are aligned relative to each other prior to step d) by a shift function such a way that in the sequential processing of several printed circuit boards,
   the bore holes that are created in the supporting layer and in the covering layer are positioned with respect to each other by a defined offset.

2. Method according to claim 1, wherein the position and/or the alignment of the printed circuit board prior to step b) is captured by optical processes, particularly by a CCD camera.

3. Method according to claim 1, wherein the position and/or the alignment of the printed circuit board prior to or subsequent to step b) is captured by X-ray.

4. Method according to claims 1, the defined offset in the drilled bore holes in the supporting layer and in the covering layer is created by applying the printed circuit boards that are to be processed sequentially respectively offset, and by drilling the bore holes at least essentially at the same positions on printed circuit boards.

5. Method according to claims 1, wherein the supporting layer and/or the covering layer are exchanged after drilling a preferably preselected number of boreholes, whereby this number is ≥10.

* * * * *